United States Patent
Watanabe et al.

(10) Patent No.: US 9,577,474 B2
(45) Date of Patent: Feb. 21, 2017

(54) DEMODULATOR FOR WIRELESS POWER TRANSMITTER

(71) Applicant: ROHM CO., LTD., Kyoto (JP)

(72) Inventors: Masatoshi Watanabe, Kyoto (JP); Manabu Miyata, Kyoto (JP); Tatsuya Iwasaki, Kyoto (JP); Tomoya Morinaga, Kyoto (JP)

(73) Assignee: ROHM CO., LTD. (JP)

( * ) Notice: Subject to any disclaimer, the term of this patent is extended or adjusted under 35 U.S.C. 154(b) by 422 days.

(21) Appl. No.: 14/307,644

(22) Filed: Jun. 18, 2014

(65) Prior Publication Data

US 2015/0069849 A1 Mar. 12, 2015

(30) Foreign Application Priority Data

Jun. 25, 2013 (JP) .................................. 2013-133089

(51) Int. Cl.
*H02J 17/00* (2006.01)
*H03D 1/00* (2006.01)
*H04B 5/00* (2006.01)

(52) U.S. Cl.
CPC ................. *H02J 17/00* (2013.01); *H03D 1/00* (2013.01); *H04B 5/0037* (2013.01); *H04B 5/0075* (2013.01); *H04B 5/0093* (2013.01)

(58) Field of Classification Search
CPC ...... H02J 17/00; H02J 17/025; H02J 17/0042; H02J 17/0052; H02J 5/005; H04B 5/0093; H04B 5/0037; H04B 5/0075; H03D 1/00
USPC ........................................................ 307/104
See application file for complete search history.

(56) References Cited

U.S. PATENT DOCUMENTS

| | | | | |
|---|---|---|---|---|
| 5,247,305 A | * | 9/1993 | Hirata | G06K 7/0008 342/44 |
| 9,253,002 B2 | * | 2/2016 | Noguchi | H04L 27/12 |
| 9,413,192 B2 | * | 8/2016 | Heo | H02J 7/025 |
| 9,438,065 B2 | * | 9/2016 | Lee | H02J 7/025 |
| 9,450,648 B2 | * | 9/2016 | Bastami | H04B 5/0037 |
| 2013/0033235 A1 | * | 2/2013 | Fukaya | H02J 17/00 320/162 |

(Continued)

FOREIGN PATENT DOCUMENTS

JP 2013-38854 A 2/2013

*Primary Examiner* — Jared Fureman
*Assistant Examiner* — Michael Warmflash
(74) *Attorney, Agent, or Firm* — Cantor Colburn LLP (57) ABSTRACT

A demodulator is mounted on a wireless power transmitter that conforms to the Qi standard, and demodulates an amplitude modulated signal superimposed on a coil current $I_{COIL}$ that flows through a primary coil of a transmission antenna, or otherwise on a coil voltage across both ends of the primary coil. Multiple demodulating units are each configured to have respectively different configurations, to operate in parallel, to extract a demodulated component from the coil current $I_{COIL}$ or otherwise from the coil voltage, and to generate baseband signals as demodulated signals. A signal processing unit employs a baseband signal that is correctly received, from among the multiple baseband signals generated by the multiple demodulating units, based on an error detection result obtained using a checksum.

11 Claims, 4 Drawing Sheets

(56) References Cited

U.S. PATENT DOCUMENTS

2013/0260676 A1* 10/2013 Singh .................. H04B 5/0037
    455/41.1
2014/0354066 A1* 12/2014 Watanabe ............... H02J 5/005
    307/104

* cited by examiner

DEMODULATOR FOR WIRELESS POWER TRANSMITTER

CROSS REFERENCE TO RELATED APPLICATION

The present invention claims priority under 35 U.S.C. §119 to Japanese Application No. 2013-133089 filed Jun. 25, 2013, the entire content of which is incorporated herein by reference.

BACKGROUND OF THE INVENTION

1. Field of the Invention

The present invention relates to a wireless power supply technique.

2. Description of the Related Art

In recent years, in order to supply electric power to an electronic device, contactless power transmission (which is also referred to as "contactless power supply" or "wireless power supply") has begun to come into commonplace use. In order to advance the compatibility of products between manufacturers, the WPC (Wireless Power Consortium) has been organized, and the WPC has developed the Qi standard as an international standard.

Figure 1:
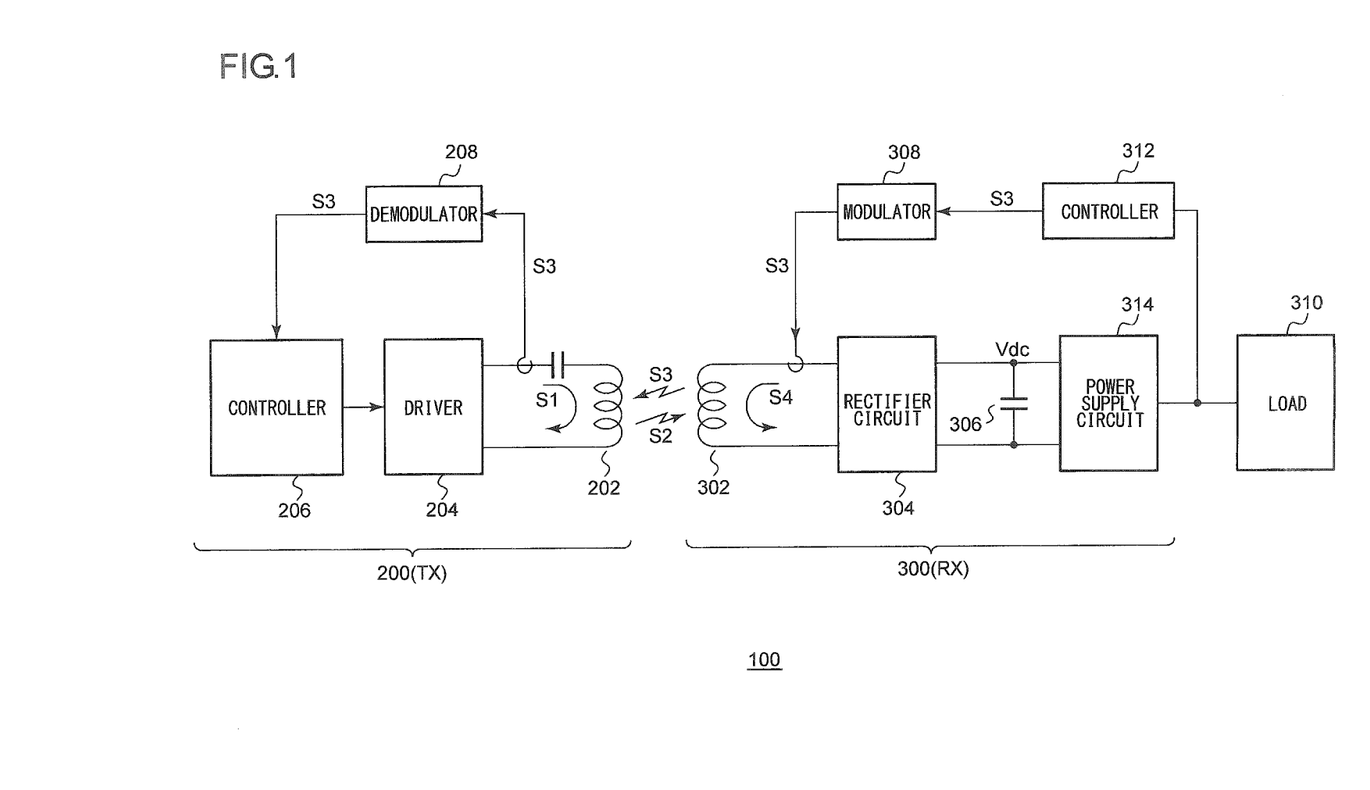
FIG. 1 is a diagram showing a configuration of a wireless power supply system that conforms the Qi standard.

FIG. 1 is a diagram showing a configuration of a wireless power supply system 100 that conforms to the Qi standard. The power supply system 100 includes a power transmitter 200 (TX) and a power receiver 300 (RX). The power receiver 300 is mounted on an electronic device, examples of which include cellular phone terminals, smartphones, audio players, game machines, and tablet terminals.

The power transmitter 200 includes a transmission coil (primary coil) 202, a driver 204, a controller 206, and a demodulator 208. The driver 204 includes an H-bridge circuit (full-bridge) circuit or otherwise a half-bridge circuit. The driver 204 applies a driving signal S1, which is configured as a driving current or otherwise a driving voltage, to the transmission coil 202 such that the transmission coil 202 generates an electric power signal S2 in an electromagnetic field. The controller 206 integrally controls the overall operation of the power transmitter 200. Specifically, the controller 206 controls the switching frequency of the driver 204 or otherwise the duty ratio of the switching operation of the driver 204 so as to adjust the electric power to be transmitted.

In the Qi standard, a protocol is defined for communication between the power transmitter 200 and the power receiver 300, which enables information transmission from the power receiver 300 to the power transmitter 200 via a control signal S3. The control signal S3 is transmitted from a reception coil 302 (secondary coil) to the transmission coil 202 in the form of an AM (Amplitude Modulation) modulated signal using backscatter modulation. The control signal S3 includes electric power control data (which will also be referred to as a "packet") which indicates an amount of electric power to be supplied to the power receiver 300, and data which indicates the particular information for the power receiver 300. The demodulator 208 demodulates the control signal S3 included in the current or otherwise the voltage applied to the transmission coil 202. The controller 206 controls the driver 204 based on the power control data included in the control signal S3 thus demodulated.

The power receiver 300 includes the reception coil 302, a rectifier circuit 304, a capacitor 306, a modulator 308, a load circuit 310, a controller 312, and a power supply circuit 314. The reception coil 302 receives the electric power signal S2 from the transmission coil 202, and transmits the control signal S3 to the transmission coil 202. The rectifier circuit 304 and the capacitor 306 rectify and smooth a current S4 induced at the reception coil 302 according to the electric power signal S2, thereby converting the current S4 into a DC voltage.

Using electric power supplied from the power transmitter 200, the power supply circuit 314 charges an unshown secondary battery or steps up or otherwise steps down the DC voltage Vdc, so as to supply the DC voltage to the controller 312 and other load circuits 310.

The controller 312 monitors the amount of electric power received by the power receiver 300, and generates electric power control data which indicates the amount of electric power thus supplied. The modulator 308 modulates the control signal S3 including the electric power control data so as to modulate the coil current that flows through the reception coil 302, thereby modulating the coil current and coil voltage applied to the transmission coil 202.

RELATED ART DOCUMENTS

Patent Document 1

Japanese Patent Application Laid Open No. 2013-38854

Description will be made regarding the communication protocol between the power transmitter 200 and the power receiver 300. The power receiver 300 communicates with the power transmitter 200 using backscatter modulation. Specifically, the power receiver 300 is configured to receive the electric power signal S2 from the power transmitter 200. In addition, the power receiver 300 modulates the amount of electric power thus received, so as to modulate the coil current and/or the coil voltage applied to the transmission coil 202. That is to say, the power transmitter 200 and the power receiver 300 use the AM modulated electric power signal S2 as a communication channel between them.

Figure 2:
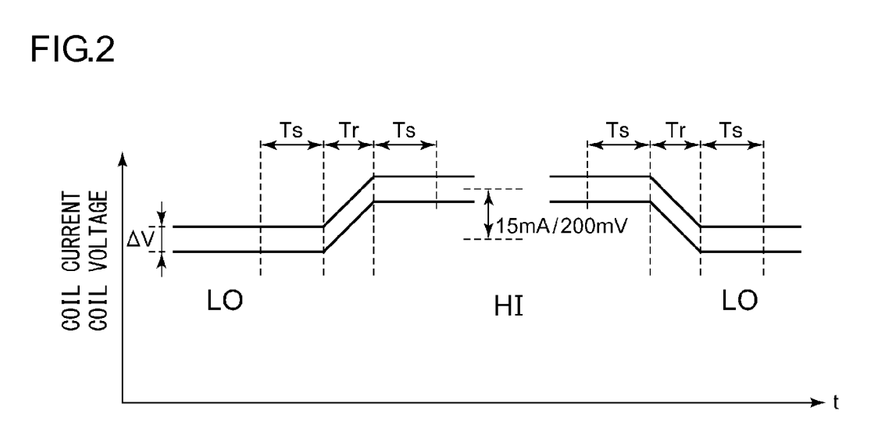
FIG. 2 is a waveform diagram showing the coil current and the coil voltage generated at a transmission coil.

FIG. 2 is a waveform diagram showing the coil current and the coil voltage generated at the transmission coil 202. The power receiver 300 switches the coil current and/or the coil voltage between two states, i.e., the Hi state and the Lo state. In the Qi standard, the difference in the coil current between the Hi state and the Lo state is defined to be equal to or greater than 15 mA. Furthermore, the difference in the coil voltage between the Hi state and the Lo state is defined to be equal to or greater than 200 mV. Moreover, the coil current fluctuation amount is defined to be 8 mA, and the coil voltage fluctuation width is defined to be 110 mA. The transition time Tr is defined to be 100 μs, and the minimum stabilization time Ts is defined to be 150 μs.

The demodulator 208 shown in FIG. 1 detects a state transition that occurs in the coil voltage or otherwise the coil current applied to the transmission antenna 201, and demodulates the control signal S3. In the Qi standard, a specific modulating method and configuration of the demodulator 208 are not defined. That is to say, the modulating method and the configuration of the demodulator 208 may be determined as desired by each manufacturer.

SUMMARY OF THE INVENTION

The present inventors have investigated such a demodulator 208, and have come to recognize the following problem.

The bias point of the coil current or the coil voltage as shown in FIG. 2 dynamically changes according to a change in the load current that flows on the power receiver 300 side, i.e., according to the amount of power transmission. Accordingly, in a case in which the demodulator 208 is designed such that it is optimized for a predetermined bias point (load current), when the load changes, the packet reception rate changes, which is a problem. It should be noted that this problem has not been generally recognized by those skilled in this art.

The present invention has been made in order to solve such a problem. Accordingly, it is an exemplary purpose of an embodiment of the present invention to provide a power transmitter configured to provide stable packet reception.

An embodiment of the present invention relates to a demodulator. The demodulator is mounted on a wireless power transmitter that conforms to a Qi standard, and is configured to demodulate an amplitude modulated signal superimposed on a coil current that flows through a primary coil of a transmission antenna, or otherwise on a coil voltage across both ends of the primary coil.

The demodulator comprises: multiple demodulating units having respectively different demodulation characteristics, and each configured to operate in parallel, and to extract a modulated component from the coil current or otherwise from the coil voltage so as to generate a baseband signal as a demodulated signal; and a signal processing unit configured to employ a baseband signal that has been correctly received, selected from among the multiple baseband signals generated by the multiple demodulating units based on an error detection result obtained using a checksum.

With such an embodiment, multiple differently configured demodulating units are prepared. The multiple demodulating units are each configured to demodulate the received modulated signal into a baseband signal in a parallel manner. Furthermore, the baseband signal that has been correctly received is employed. Thus, such an arrangement provides stable packet reception in various kinds of situations.

Also, the multiple demodulating units may each be configured to have a high reception rate in respectively different load current ranges.

Thus, such an arrangement allows a packet to be correctly received by means of the optimum demodulating unit suitable for the load current (bias point) at that point in time, even if the bias point of the coil voltage or otherwise the coil current changes due to a change in the load current that flows through the receiver.

Also, the signal processing unit may be configured to sequentially set each of multiple baseband signals as a checksum target.

Also, at least one from among the multiple demodulating units may comprise a diode rectifier circuit configured to perform rectification of the coil current or otherwise of the coil voltage. Such an arrangement provides an improved reception rate when the load current is large.

Also, at least one from among the multiple demodulating units may comprise a bridge circuit configured to perform synchronous detection of the coil current or otherwise of the coil voltage. Such an arrangement provides an improved reception rate when the load current is small.

Also, the demodulator may further comprise a current transformer configured to generate a detection signal that corresponds to the coil current that flows through the transmission antenna.

Also, the demodulator may be monolithically integrated on a single semiconductor substrate. Examples of such a "monolithically integrated" arrangement include: an arrangement in which all the circuit components are formed on a semiconductor substrate; and an arrangement in which principal circuit components are monolithically integrated.

Also, a part of the circuit components such as resistors and capacitors may be arranged in the form of components external to such a semiconductor substrate in order to adjust the circuit constants. By integrating the circuit in the form of a single IC, such an arrangement provides an advantage of a reduced circuit area, and an advantage of maintaining uniform circuit element characteristics.

Another embodiment of the present invention relates to a control circuit employed in a wireless power transmitter that conforms to a Qi standard. The wireless power transmitter comprises a transmission antenna comprising a primary coil, and a driver connected to the transmission antenna. The control circuit comprises: any one of the aforementioned demodulators configured to demodulate an amplitude modulated signal superimposed on a coil current that flows through a primary coil of a transmission antenna, or otherwise on a coil voltage across both ends of the primary coil; and a controller configured to control the driver based on a baseband signal received from the demodulator.

Also, the control circuit may be monolithically integrated on a single semiconductor substrate.

Yet another embodiment of the present invention relates to a wireless power transmitter that conforms to the Qi standard. The wireless power transmitter comprises: a transmission antenna comprising a primary coil; a driver connected to the transmission antenna; a controller configured to control the driver; and any one of the aforementioned demodulators configured to demodulate an amplitude modulated signal superimposed on a coil current that flows through the primary coil, or otherwise on a coil voltage across both ends of the primary coil.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

Figure 3:
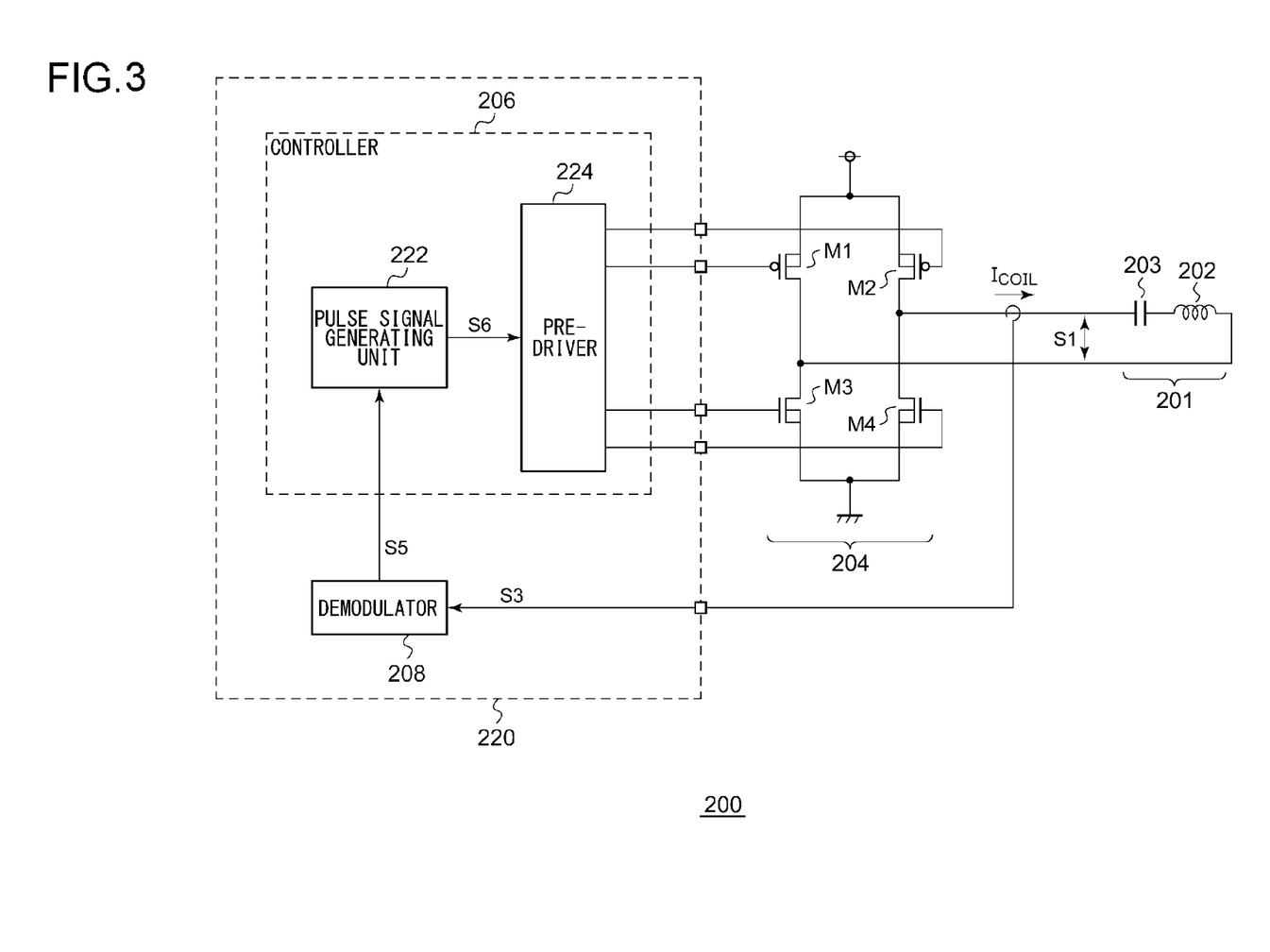
FIG. 3 is a circuit diagram showing a configuration of a wireless power transmitter according to an embodiment.

FIG. 3 is a circuit diagram showing a configuration of a wireless power transmitter (which will simply be referred to as the "power transmitter" hereafter) 200 according to an embodiment. The power transmitter 200 is employed in a power supply system 100 that conforms to the Qi standard shown in FIG. 1.

The power transmitter 200 includes a transmission antenna 201, a driver 204, and a control circuit 220.

The transmission antenna 201 includes a transmission coil 202 and a resonance capacitor 203 connected in series, and is configured to have a predetermined resonance frequency fr.

The driver 204 is configured as an H-bridge circuit including transistors M1 through M4. The driver 204 applies a pulse-shaped driving signal S1 having a frequency in the vicinity of the resonance frequency fr between both ends of the transmission antenna 201. The driver 204 may be configured as a half-bridge circuit.

The control circuit 220 includes a controller 206 and a demodulator 208, and is configured as a function IC (Integrated Circuit) which is monolithically integrated on a single semiconductor substrate. The demodulator 208 demodulates a control signal S3 received via the transmission antenna 201 from a receiver (not shown). The controller 206 controls the driver 204 according to a baseband signal S5 that corresponds to the control signal S3 thus demodulated.

The controller 206 includes a pulse signal generating unit 222 and a pre-driver 224. Based on the baseband signal S5 including electric power control data, the pulse signal generating unit 222 generates a pulse signal S6 configured as an instruction to switch on and off the transistors M1 through M4. The pre-driver 224 performs switching of the transistors M1 through M4 of the driver 204 according to the pulse signal S6.

With the power transmitter 200 shown in FIG. 3, the electric power transmission is adjusted according to the frequency of the driving signal S1 applied by the driver 204 to the transmission coil 202, i.e., the frequency of the pulse signal S6. Specifically, as the frequency of the pulse signal S6 becomes closer to the resonance frequency of the antenna including the transmission coil 202, the amount of power transmission becomes greater. Conversely, as the difference between the frequency of the pulse signal S6 and the resonance frequency becomes greater, the amount of power transmission becomes smaller. That is to say, the pulse signal generating unit 222 adjusts the frequency of the pulse signal S6 according to the baseband signal S5.

Figure 4:
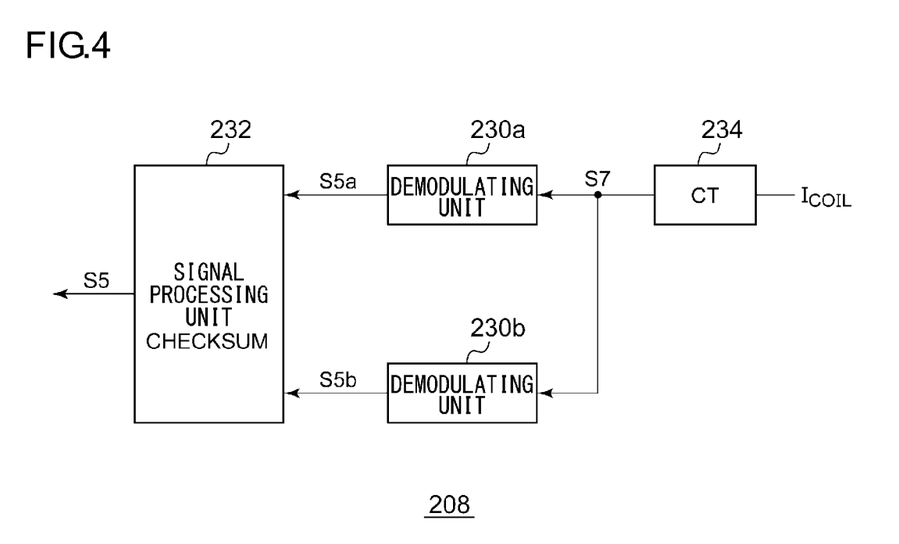
FIG. 4 is a circuit diagram showing a configuration of a demodulator shown in FIG. 3.

FIG. 4 is a circuit diagram showing a configuration of the demodulator 208 shown in FIG. 3. The demodulator 208 demodulates the amplitude modulated signal S3, which is superimposed on a coil current $I_{COIL}$ that flows through the primary coil 202 of the transmission antenna 201 or otherwise on a coil voltage $V_{COIL}$ across both ends of the primary coil 202. Description will be made in the present embodiment regarding an arrangement in which the demodulator 208 demodulates the amplitude-demodulated signal S3 superimposed on the coil current $I_{COIL}$.

The demodulator 208 includes multiple demodulating units 230a and 230b, a signal processing unit 232, and a current transformer 234. Description will be made in the present embodiment regarding an arrangement including two demodulating units. However, the number of demodulating units is not restricted in particular.

The current transformer 234 generates a detection signal S7 that corresponds to the coil current $I_{COIL}$.

The multiple demodulating units 230a and 230b have respectively different demodulation characteristics. The multiple demodulating units 230a and 230b each operate in a parallel manner. The multiple demodulating units 230a and 230b each extract a demodulation component from the detection signal S7 that corresponds to the coil current $I_{COIL}$, thereby generating baseband signals S5a and S5b in the form of demodulated signals.

Preferably, the multiple demodulating units 230a and 230b are each configured to have a high reception rate in respectively different load current ranges.

The demodulating unit 230a may include a diode rectifier circuit which rectifies the coil current $I_{COIL}$ (or otherwise the coil voltage $V_{COIL}$), for example. The diode rectifier circuit converts the frequency component of the pulse signal S6 included in the coil current $I_{COIL}$ into a DC signal. Furthermore, an RC filter removes the DC component from the pulse signal S6 thus DC converted, thereby extracting the amplitude modulated signal S3. The demodulating unit 230a demodulates the amplitude-modulated signal S3 into a baseband signal S5a. Such a demodulation mode will also be referred as the "current mode" in the present specification.

On the other hand, the demodulating unit 230b may include a bridge circuit which performs synchronous detection of the coil current $I_{COIL}$ (or otherwise the coil voltage $V_{COIL}$), for example. The bridge circuit performs synchronous detection of the coil current $I_{COIL}$ so as to extract a component of the coil current $I_{COIL}$ which is a flat component in the vicinity of the peak of the coil current $I_{COIL}$, thereby extracting the amplitude modulated signal S3 included in the coil current $I_{COIL}$. The demodulating unit 230b demodulates the amplitude demodulated signal S3 thus extracted into the baseband signal S5b. Such a demodulation mode will also be referred to as the "synchronous mode" in the present specification.

The signal processing unit 232 performs error detection by means of a checksum, and employs the correctly received baseband signal S5 from among the multiple baseband signals S5a and S5b generated by the multiple demodulating units 230a and 230b.

The above is the configuration of the demodulator 208. Next, description will be made regarding the operation of the demodulator 208.

The demodulating units 230a and 230b respectively and simultaneously generate the baseband signals S5a and S5b based on the detection signal S7 that corresponds to the coil current $I_{COIL}$.

For example, the signal processing unit 232 sequentially sets the multiple baseband signals S5a and S5b as the checksum target. Specifically, the signal processing unit 232 sets the baseband signal S5a as the checksum target. When judgment has been made that the baseband signal S5a has been correctly received, the baseband signal S5a is employed, and is output to the controller 206. When judgment has been made that the baseband signal S5a has not been correctly received, the next baseband signal S5b is set as the checksum target. When judgment has been made that the baseband signal S5b has been correctly received, the baseband signal S5b is output to the controller 206. When judgment has been made that the baseband signal S5b has not been correctly received, the power transmitter 200 returns an error notice to the power receiver 300.

The above is the operation of the demodulator 208.

With the demodulator 208 according to the embodiment, multiple differently configured demodulators 230 are prepared. The multiple demodulators 230 thus prepared generate respective baseband signals S5 as demodulated signals in a parallel manner. By employing the correctly received baseband signal S5, such an arrangement provides stable packet reception in various kinds of situations.

In particular, the multiple demodulators 230a and 230b are each configured to have a high reception rate in respectively different load current ranges. Thus, such an arrangement allows a packet to be correctly received by means of the optimum demodulator suitable for the load current (bias point) at that point in time, selected from among the multiple demodulators, even if the bias point of the coil voltage or otherwise the coil current changes due to a change in the load current that flows through the receiver 300.

One of the multiple demodulators 230 is configured as a current mode demodulator. Such a demodulator 230 thus configured has a high reception rate when the load current is large. Furthermore, one of the demodulators 230 is configured as a synchronous mode demodulator. Such a demodulator 230 thus configured has a high reception rate when the load current is small.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

The combination of the configurations of the multiple demodulators 230 and the combination of the modes employed in the multiple demodulators 230 are not restricted in particular. The backscatter-modulated signal may be demodulated using any one of known techniques.

Description has been made in the embodiment regarding an arrangement in which the multiple demodulating units 230 each generate a baseband signal S5 as a demodulated signal based on the coil current $I_{COIL}$. Also, a part of or all of the demodulators 230 may generate respective baseband signals S5 as demodulated signals based on the coil voltage $V_{COIL}$.

[Second Modification]

Description has been made in the embodiment regarding a wireless power transmitter that conforms to the Qi standard. The present invention is not restricted to such an arrangement. Also, the present invention is applicable to a wireless power transmitter employed in a system that resembles the Qi standard. Also, the present invention is applicable to a power transmitter 200 that conforms to a standard which will be developed in the future.

While the preferred embodiments of the present invention have been described using specific terms, such description is for illustrative purposes only, and it is to be understood that changes and variations may be made without departing from the spirit or scope of the appended claims.

What is claimed is:

1. A demodulator mounted on a wireless power transmitter that conforms to a Qi standard, and configured to demodulate an amplitude modulated signal superimposed on a coil current that flows through a primary coil of a transmission antenna, or otherwise on a coil voltage across both ends of the primary coil, the demodulator comprising:

a plurality of demodulating units having respectively different demodulation characteristics, and each configured to operate in parallel, and to extract a modulated component from the coil current or otherwise from the coil voltage so as to generate a baseband signal as a demodulated signal; and a signal processing unit configured to employ a baseband signal that has been correctly received, selected from among the plurality of baseband signals generated by the multiple demodulating units based on an error detection result obtained using a checksum.

2. The demodulator according to claim 1, wherein the plurality of demodulating units are each configured to have a high reception rate in respectively different load current ranges.

3. The demodulator according to claim 1, wherein the signal processing unit is configured to sequentially set each one of the plurality of baseband signals as a checksum target.

4. The demodulator according to claim 1, wherein at least one from among the plurality of demodulating units comprises a diode rectifier circuit configured to perform diode rectification of the coil current or otherwise of the coil voltage.

5. The demodulator according to claim 1, wherein at least one from among the plurality of demodulating units comprises a bridge circuit configured to perform synchronous detection of the coil current or otherwise of the coil voltage.

6. The demodulator according to claim 1, further comprising a current transformer configured to generate a detection signal that corresponds to the coil current that flows through the transmission antenna.

7. The demodulator according to claim 1, monolithically integrated on a single semiconductor substrate.

8. A control circuit employed in a wireless power transmitter configured to conform to a Qi standard, comprising a transmission antenna that comprises a primary coil, and a driver connected to the transmission antenna, the control circuit comprising:

the demodulator according to claim 1, configured to demodulate an amplitude modulated signal superimposed on a coil current that flows through a primary coil of a transmission antenna, or otherwise on a coil voltage across both ends of the primary coil; and a controller configured to control the driver based on a baseband signal received from the demodulator.

9. The control circuit according to claim 8, monolithically integrated on a single semiconductor substrate.

10. A wireless power transmitter comprising:

a transmission antenna comprising a primary coil;

a driver connected to the transmission antenna;

a controller configured to control the driver; and the demodulator according to claim 1, configured to demodulate an amplitude modulated signal superimposed on a coil current that flows through the primary coil, or otherwise on a coil voltage across both ends of the primary coil.

11. A method employed in a wireless power transmitter that conforms to a Qi standard for demodulating an amplitude modulated signal superimposed on a coil current that flows through a primary coil of a transmission antenna, or otherwise on a coil voltage across both ends of the primary coil, the method comprising:

providing a plurality of demodulating units having respectively different demodulation characteristics;

operating the plurality of demodulating units in parallel so as to instruct each demodulating unit to extract a demodulated component from the coil current or otherwise from the coil voltage, and to generate a baseband signal as a demodulated signal; and     employing a baseband signal that is correctly received, from among the plurality of baseband signals generated by the plurality of demodulating units, based on an error detection result obtained using a checksum.

* * * * *